US010361149B2

(12) United States Patent
Zuo et al.

(10) Patent No.: US 10,361,149 B2
(45) Date of Patent: Jul. 23, 2019

(54) LAND GRID ARRAY (LGA) PACKAGING OF PASSIVE-ON-GLASS (POG) STRUCTURE

(71) Applicant: QUALCOMM Incorporated, San Diego, CA (US)

(72) Inventors: Chengjie Zuo, San Diego, CA (US); Mario Francisco Velez, San Diego, CA (US); Changhan Hobie Yun, San Diego, CA (US); David Francis Berdy, San Diego, CA (US); Daeik Daniel Kim, Del Mar, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/233,906

(22) Filed: Aug. 10, 2016

(65) Prior Publication Data

US 2018/0047660 A1    Feb. 15, 2018

(51) Int. Cl.
*H01L 23/498* (2006.01)
*H01L 21/48* (2006.01)
*H01L 21/56* (2006.01)
*H01L 23/15* (2006.01)
*H01L 23/31* (2006.01)
(Continued)

(52) U.S. Cl.
CPC .... *H01L 23/49805* (2013.01); *H01L 21/4846* (2013.01); *H01L 21/56* (2013.01); *H01L 23/145* (2013.01); *H01L 23/15* (2013.01); *H01L 23/3121* (2013.01); *H01L 23/49811* (2013.01); *H01L 23/49822* (2013.01); *H01L 23/49827* (2013.01); *H01L 24/02* (2013.01);
(Continued)

(58) Field of Classification Search
CPC ... H01L 23/522–5389; H01L 23/49805; H01L 23/15
See application file for complete search history.

(56) References Cited

U.S. PATENT DOCUMENTS 4,922,376 A    5/1990 Pommer et al.
7,968,800 B2   6/2011 Sasaoka et al.
(Continued)

FOREIGN PATENT DOCUMENTS

WO    2009139121 A1    11/2009

OTHER PUBLICATIONS

International Search Report and Written Opinion—PCT/US2017/043136—ISA/EPO—dated Oct. 24, 2017.

*Primary Examiner* — Julia Slutsker
(74) *Attorney, Agent, or Firm* — Muncy, Geissler, Olds & Lo

(57) ABSTRACT

A device includes a passive-on-glass (POG) structure and an interface layer. The POG structure includes a passive component and at least one contact pad on a first surface of a glass substrate. The interface layer has a second surface on the first surface of the glass substrate such that the passive component and the at least one contact pad are located between the first surface of the glass substrate and the interface layer. The interface layer includes at least one land grid array (LGA) pad formed on a third surface of the interface layer, where the third surface of the interface layer is opposite the second surface of the interface layer. The interface layer also includes at least one via formed in the interface layer configured to electrically connect the at least one contact pad with the at least one LGA pad.

27 Claims, 6 Drawing Sheets

(51) Int. Cl.
*H01L 23/14* (2006.01)
*H01L 23/00* (2006.01)
*H05K 1/02* (2006.01)
H01L 23/64 (2006.01)
H05K 3/34 (2006.01)

(52) U.S. Cl.
CPC .......... *H05K 1/0218* (2013.01); *H01L 23/645* (2013.01); *H05K 3/3436* (2013.01); *H05K 2201/10719* (2013.01)

(56) References Cited

U.S. PATENT DOCUMENTS

| | | |
|---|---|---|
| 8,362,599 B2 | 1/2013 | Kim et al. |
| 2009/0302436 A1* | 12/2009 | Kim ..................... H01L 21/561 |
| | | 257/659 |
| 2013/0221452 A1* | 8/2013 | Strothmann ............ H01L 24/20 |
| | | 257/414 |
| 2013/0241071 A1* | 9/2013 | Hsieh ..................... H01L 24/13 |
| | | 257/773 |
| 2014/0035935 A1 | 2/2014 | Shenoy et al. |
| 2015/0201495 A1* | 7/2015 | Kim ..................... H05K 1/0306 |
| | | 174/255 |
| 2015/0271920 A1 | 9/2015 | Kim et al. |

\* cited by examiner

LAND GRID ARRAY (LGA) PACKAGING OF PASSIVE-ON-GLASS (POG) STRUCTURE

FIELD OF DISCLOSURE

Disclosed embodiments are directed to packaging of semiconductor structures. More specifically, exemplary embodiments are directed to a land grid array (LGA) packaging of a passive-on-glass (POG) structure to a printed circuit board (PCB).

BACKGROUND

Semiconductor packages typically involve one or more semiconductor dies integrated on a substrate, such as, a glass substrate. Passive components such as capacitors and inductors as well as contact pads may be formed on the substrate. The substrate is then attached to a package base, such as, a printed circuit board (PCB). The substrate may be attached to the PCB by way of Ball grid arrays (BGAs). The BGAs include solder balls which may be utilized for forming the connections and attachment between the contact pads of the substrate and the PCB.

For example, with reference to FIG. 1, a side view of a conventional semiconductor package 100 is illustrated. Package 100 includes a glass substrate 102 with a passive component (e.g., inductor 104) and contact pads 103 attached on a bottom surface of glass substrate 102. The combination of glass substrate with inductor 104 may be referred to as a passive-on-glass (POG) structure. The POG structure of glass substrate 102 and inductor 104 is attached to PCB 108 using solder balls which form BGA 106.

However, ball height control of BGA 106 of POG structures may be an issue for customers that utilize different PCB technologies. For example, the line spacing of a top metal layer of PCB 108 may affect the ball height 111 of BGA 106 after assembly. That is, a smaller line spacing of PCB 108 may result in a higher ball height 111 of BGA 106 as compared to a PCB 108 with larger line spacing, due to a difference in the amount the solder balls of BGA 106 collapse after soldering. With this variation in ball height of BGA 106, so too does the spacing between the passive component (e.g., inductor 104) of substrate 102 and the ground plane 110 of PCB 108. As shown in FIG. 1, the inductor 104 is separated from ground plane 110 by a distance 112. Ground plane 110 is an electrically conductive surface connected to an electrical ground. For example, ground plane 110 may be a large area of copper foil which is connected to the ground terminal (not illustrated) of PCB 108, and serves as a ground or return path for current from the various components integrated on PCB 108. The resultant value (i.e., after assembly of package 100) of the passive component (e.g., inductance of inductor 104 or capacitance of a capacitor) may be dependent on the distance 112 between the passive component and the ground plane 110. Thus, in some implementations, the PCB technology utilized by PCB 108 must be taken into account prior to assembly of package 100 when forming the passive component (e.g., inductor 104) to account for the anticipated distance 112.

SUMMARY

According to one aspect of the present disclosure, a device includes a passive-on-glass (POG) structure and an interface layer. The POG structure includes a passive component and at least one contact pad on a first surface of a glass substrate. The interface layer has a second surface on the first surface of the glass substrate such that the passive component and the at least one contact pad are located between the first surface of the glass substrate and the interface layer. The interface layer includes at least one land grid array (LGA) pad on a third surface of the interface layer, where the third surface of the interface layer is opposite the second surface of the interface layer. The interface layer also includes at least one via in the interface layer configured to electrically connect the at least one contact pad with the at least one LGA pad.

According to another aspect, a package includes a passive-on-glass (POG) structure, a mold, and a printed circuit board (PCB). The POG structure includes a glass substrate, a passive component on a first surface of the glass substrate, and at least one contact pad on the first surface of the glass substrate. The mold includes a second surface on the first surface of the glass substrate and on the passive component and the at least one contact pad, such that the passive component and the at least one contact pad are located between the first surface of the glass substrate and the mold. The mold further includes at least one land grid array (LGA) pad and at least one via. The LGA pad is on a third surface of the mold, wherein the third surface of the mold is opposite the second surface of the mold. The at least one via is formed in the mold and configured to electrically connect the at least one contact pad with the at least one LGA pad. The PCB includes a ground plane and a top metal layer including a PCB contact pad, where the PCB contact pad is directly connected to the at least one LGA pad on the third surface of the mold.

According to yet another aspect, a device includes a passive-on-glass (POG) structure. The POG structure includes a glass substrate, a passive component on a first surface of the glass substrate, and at least one contact pad on the first surface of the glass substrate. The device also includes at least one land grid array (LGA) pad on a surface of the device that is to be incident with a printed circuit board (PCB) of a package. Further included in the device is a means for electrically connecting the at least one contact pad with the at least one LGA pad while maintaining a distance between the passive component and a ground plane of the PCB that is independent of a line spacing utilized by the PCB.

According to another aspect, a method of forming a device includes providing a passive-on-glass (POG) structure that includes providing a glass substrate, disposing a passive component on a first surface of the glass substrate, and forming at least one contact pad on the first surface of the glass substrate. The method also includes forming an interface layer having a second surface on the first surface of the glass substrate such that the passive component and the at least one contact pad are located between the first surface of the glass substrate and the interface layer. Forming the interface layer further includes forming at least one land grid array (LGA) pad on a third surface of the interface layer, where the third surface of the interface layer is opposite the second surface of the interface layer. Forming the interface layer also includes forming at least one via in the interface layer to electrically connect the at least one contact pad with the at least on LGA pad.

BRIEF DESCRIPTION OF THE DRAWINGS

The accompanying drawings are presented to aid in the description of embodiments of the various embodiments and are provided solely for illustration of the embodiments and not limitation thereof.

DETAILED DESCRIPTION

Aspects of the various embodiments are disclosed in the following description and related drawings directed to specific embodiments. Alternate embodiments may be devised without departing from the scope of the present disclosure. Additionally, well-known elements of the various embodiments will not be described in detail or will be omitted so as not to obscure the relevant details of the various embodiments.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 1:
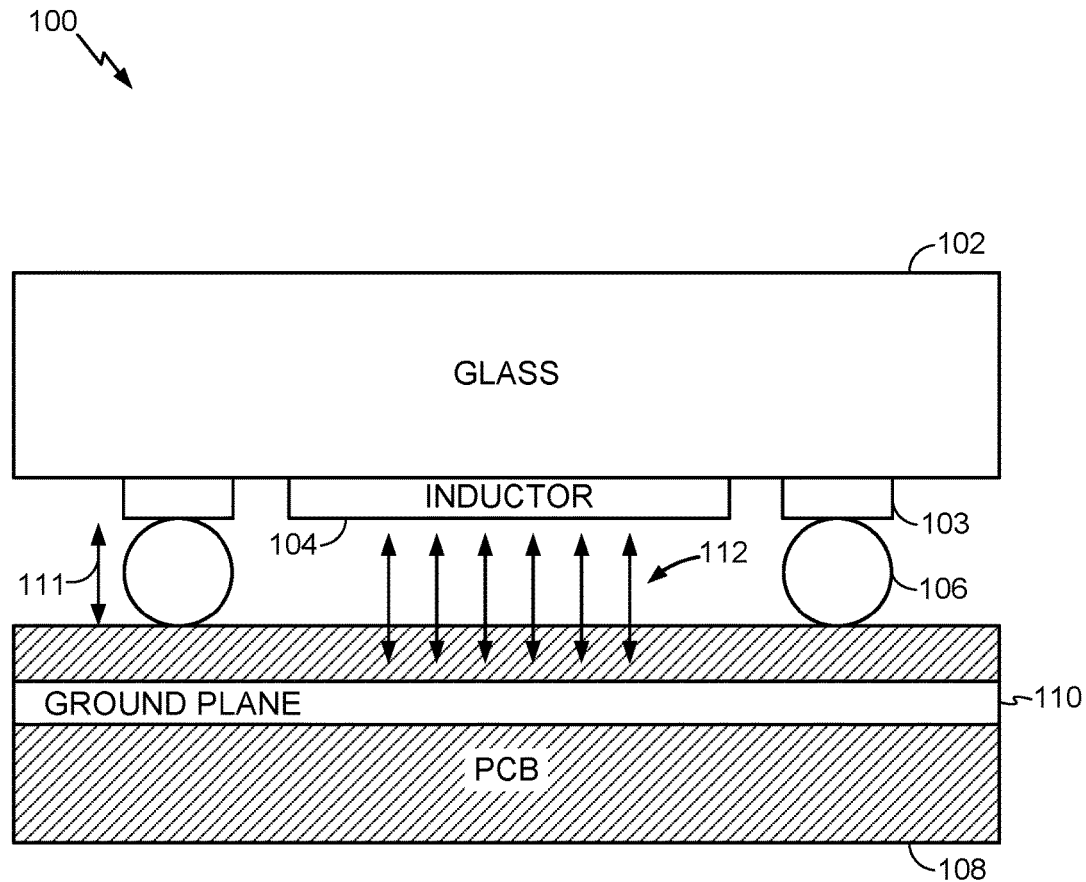
FIG. 1 illustrates a semiconductor package comprising a POG structure formed on a PCB.

As mentioned above, the resultant value of a passive component included in a POG structure may be dependent on the distance between the passive component of a glass substrate and the ground plane included in the printed circuit board (PCB). As shown with reference to FIG. 1, conventional packaging techniques using BGA 106 may result in variances in the distance 112 between the inductor 104 and the ground plane 110 depending on the PCB technology (e.g., line spacing, layer thickness, etc.) utilized by the PCB 108. Accordingly, aspects of the present disclosure provide for a POG structure with an associated interface layer that provides for control of the distance 112 independent of the PCB technology utilized by the PCB. That is, in some examples, the POG structures and associated interface layer provided herein may maintain the same distance 112 for PCBs that use a small line spacing or thinner layers as with those that utilize a larger line spacing or thicker layers.

As will be discussed in more detail below, aspects of the present disclosure may include a device that includes a POG structure and an interface layer, where the interface layer includes one or more land grid array (LGA) pads on a surface of the device that is to be incident with a PCB of a package. The LGA pads are configured to electrically connect the contact pads of a glass substrate of the POG structure with PCB contact pads of the PCB, where the interface layer maintains the distance 112 between the passive component of the POG structure and the ground plane of the PCB regardless of the line spacing and/or layer thickness of the PCB.

Figure 2A:
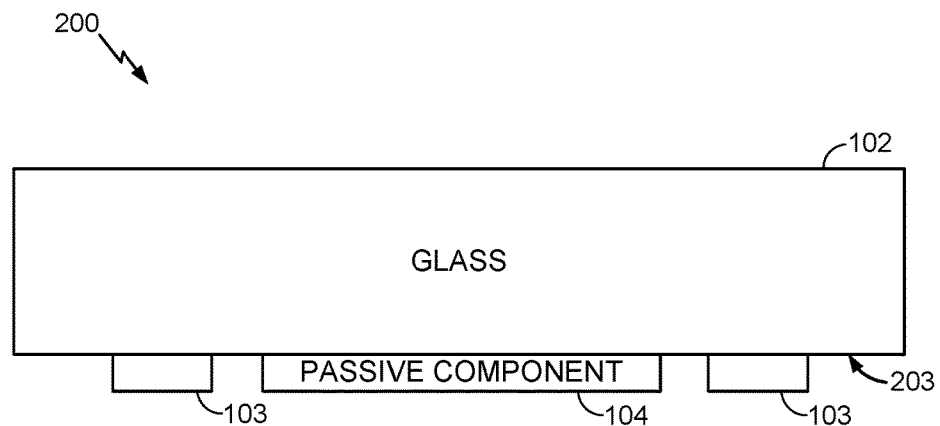
FIGS. 2A-H illustrate the fabrication of a device having a POG structure and interface layer for assembly in a package.

For example, FIGS. 2A-H illustrate the fabrication of a device 200 having a POG structure and interface layer 205 for assembly in a package. As shown in FIG. 2A, a POG structure is illustrated. The POG structure is shown to include a glass substrate 102 and a passive component 104 on a first surface 203 of glass substrate 102. In one aspect, the passive component 104 includes a capacitor. In another aspect, the passive component 104 includes an inductor. Also included in the POG structure are contact pads 103.

Figure 2B:
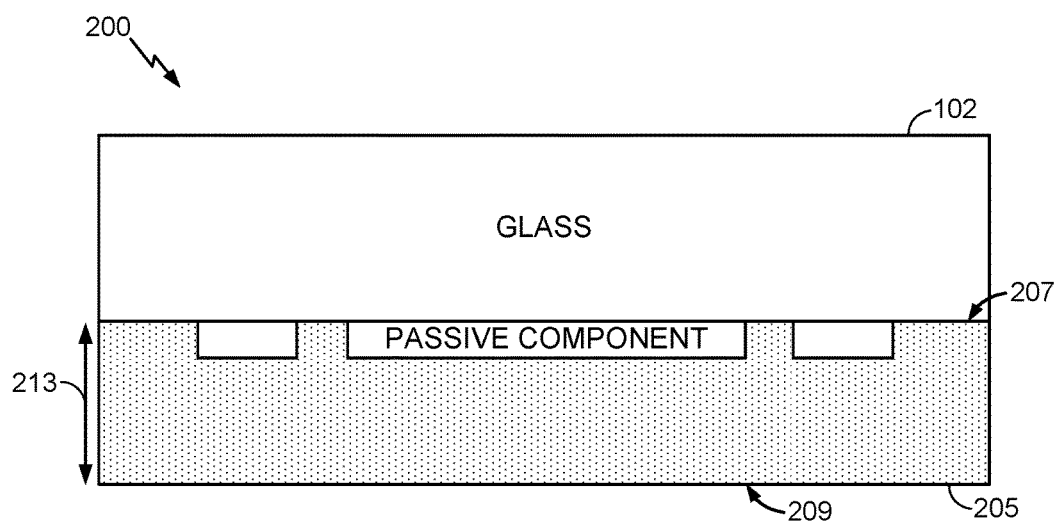

With reference to FIG. 2B, an interface layer 205 having a second surface 207 is formed on the first surface 203 of the glass substrate 102, such that the passive component 104 and contact pads 103 are located between the first surface 203 and the interface layer 205. In one aspect, interface layer 205 is a mold formed by applying a molding compound on the first surface 203 of the glass substrate 102 over the passive component 104 and contact pads 103. In some examples, the molding compound includes a dielectric material, or insulator, such as a low-loss insulating material.

As will be discussed more below, interface layer 205 may provide for control of the distance between the passive component 104 and the ground plane of the to-be-attached PCB. For example, the forming of interface layer 205 may include adjusting or otherwise controlling the thickness 213 (i.e., distance from surface 207 to surface 209) of interface layer 205. In one aspect, the thickness 213 of interface layer 205 may be controlled by the grinding of surface 209. Thus, in some applications, interface layer 205 may be formed to have a thickness 213 that is the same as a ball height requirement specified by the PCB that device 200 will be packaged with (e.g., ball height 111 of FIG. 1).

Figure 2C:
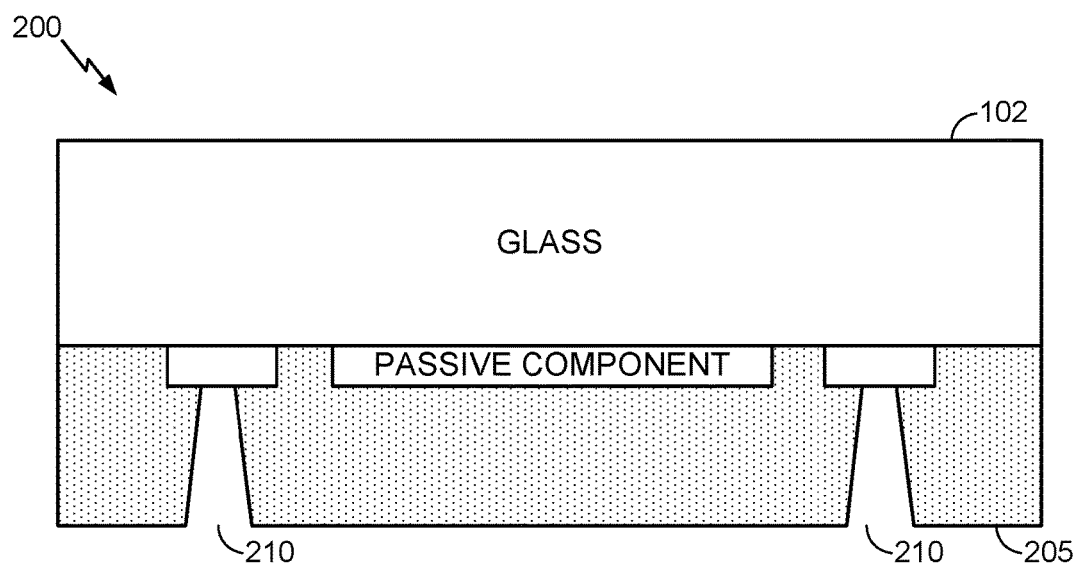
Figure 2D:
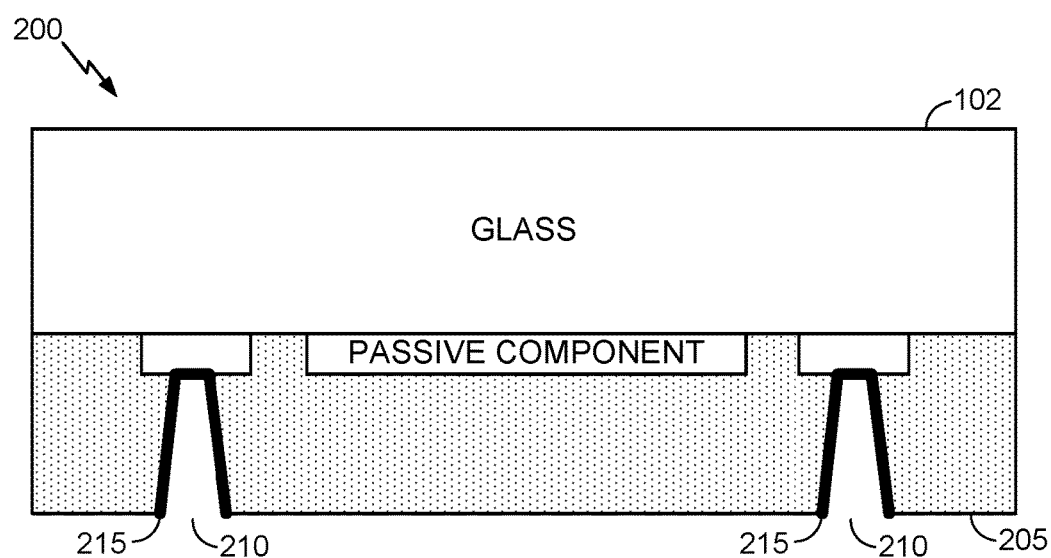
Figure 2E:
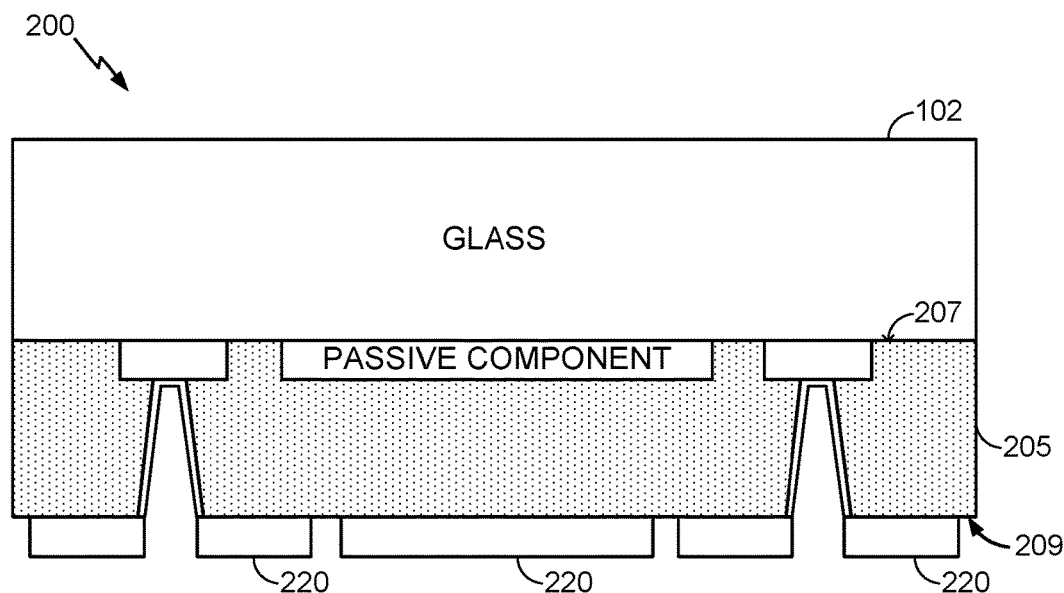

Next, with reference to FIG. 2C, vias 210 are formed in the interface layer 205. In one aspect, vias 210 are formed by way of laser drilling though interface layer 205 to expose the contact pads 103. FIG. 2D then illustrates a deposition of seed layer 215 in the vias 210. Next, a photoresist patterning may be performed on a third surface 209 of the interface layer 205 with a subsequent land grid array (LGA) pad plating process performed to form LGA pads 220 (shown in FIG. 2E). As shown in FIG. 2E, the LGA pads 220 are formed on the third surface 209 of the interface layer 205, where the third surface 209 is opposite the second surface 207. In one aspect, the third surface 209 is the surface of the device 200 that is to be incident with a PCB during packaging of the device into a package. As can be seen in FIG. 2E, the vias 210 are configured to electrically connect the contact pads 103 of the glass substrate 102 with the LGA pads 220. In some examples, there is a one-to-one correspondence between the contact pads 103 and the LGA pads 220. Furthermore, in some examples, a spacing between LGA pads 220 is the same as the spacing between contact pads 103. That is, the LGA pads 220 may be formed without redistribution of the contact pads 103.

Figure 2F:
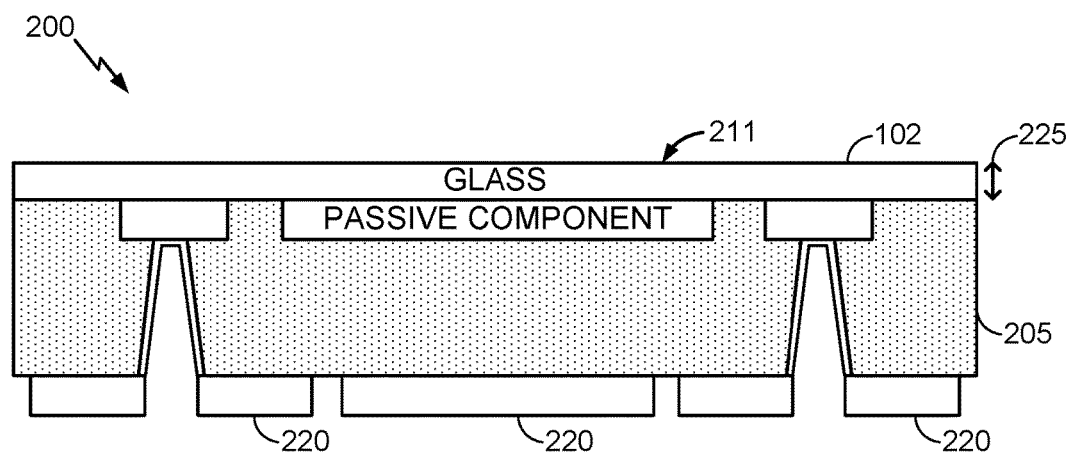

FIG. 2F illustrates an optional step of forming the device 200 that includes the thinning of the glass substrate 102. As shown in FIG. 2F, the height 225 of the glass substrate 102 has been reduced. In one aspect, the height 225 of the glass substrate 102 may be reduced since the interface layer 205 provides added stability during the reduction process. For example, the interface layer 205 may be utilized as a handle wafer while grinding down the top surface 211 of the glass substrate 102. In some aspects, the height 225 of the glass substrate 102 may be reduced by way of a mechanical or chemical polishing of top surface 211.

Figure 2G:
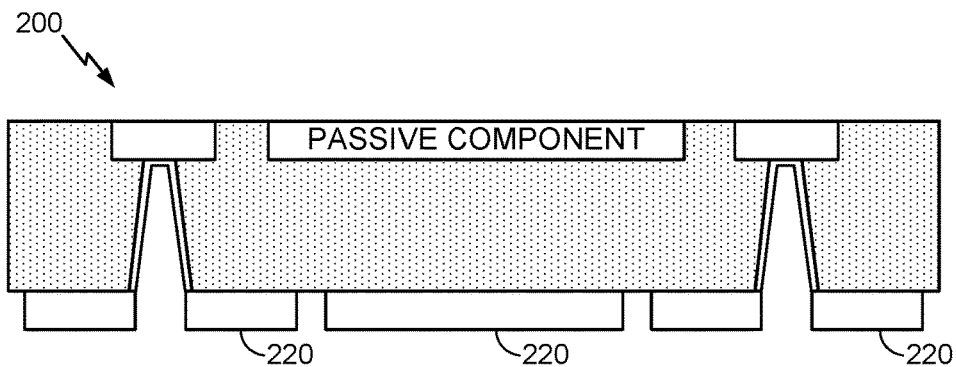

Furthermore, FIG. 2G illustrates another optional step where the glass substrate 102 has been completely removed. Similar to the optional process of FIG. 2F, the glass substrate 102 may be completely removed since the interface layer 205 provides added stability during the reduction process. For example, the interface layer 205 may be utilized as a handle wafer while grinding down the top surface 211 of the glass substrate 102. In some aspects, a mechanical or chemical polishing of top surface 211 may be performed until the glass substrate 102 is completely removed.

Figure 2H:
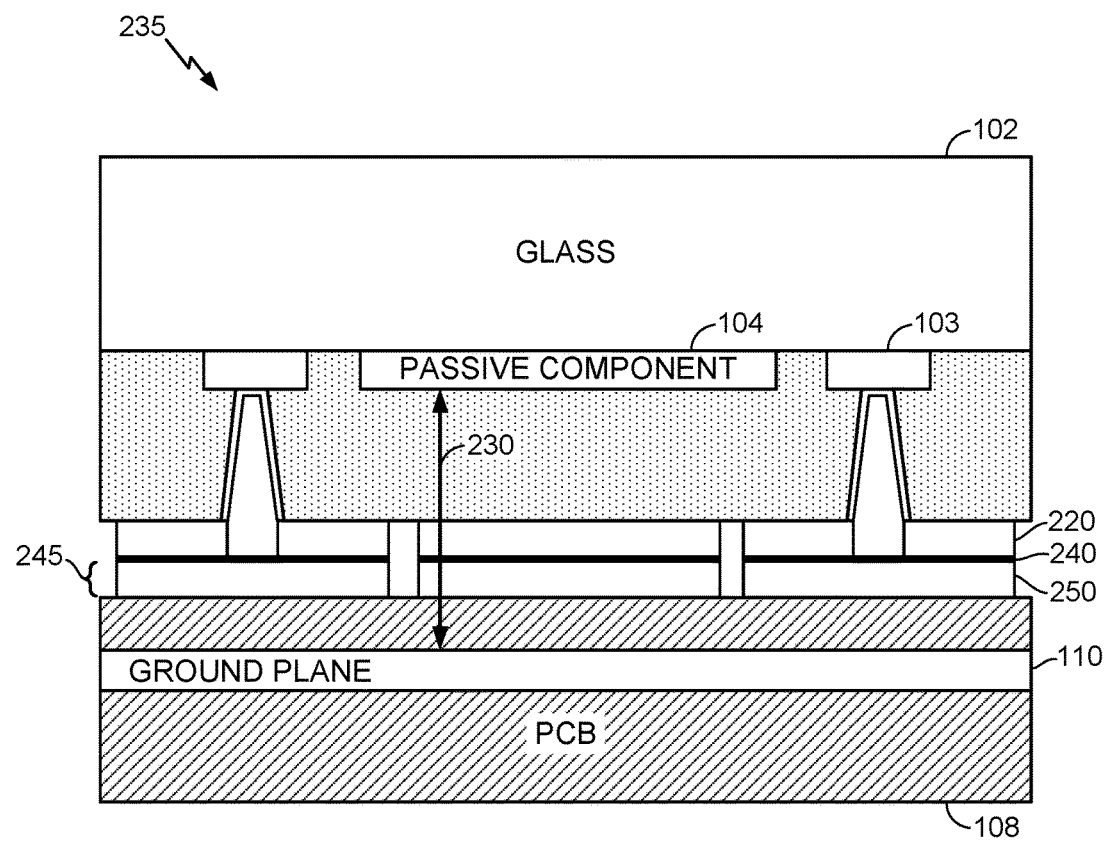

FIG. 2H illustrates the optional process of packaging the device 200 into a package 235. As shown in FIG. 2H, PCB 108 includes a ground plane 110, as well as a top metal layer 245 that includes one or more PCB contact pads 250. Packaging the device 200 into the package 235 may include attaching (e.g., soldering) the PCB contact pads 250 to the LGA pads 220 at the third surface 209 of the interface layer 205. In one aspect, the PCB contact pads 250 are directly connected (physically and electrically connected without intervening layers other than solder layer 240) to the LGA pads 220. In some aspects, solder layer 240 provides for a much smaller collapse height after soldering, when compared to the BGA 106 of FIG. 1. Thus, in some examples, the use of LGA pads 220 with solder layer 240 may provide for a more consistent distance 230 that is independent of the PCB technology used by PCB 108.

As can be seen in FIG. 2H, the ground plane 110 of PCB 108 is separated from the passive component 104 by distance 230. As mentioned above, the resultant value of the passive component 104 may be dependent on the distance 230. However, the interface layer 205 and associated LGA pads 220 provide for a consistent distance 230 that is independent of the PCB technology (e.g., line spacing, layer thickness, etc.) of the PCB 108. Furthermore, interface layer 205 may provide for control of distance 230 depending on the application. For example, as mentioned above, the forming of interface layer 205 may include adjusting or otherwise controlling the thickness 213 of interface layer 205 to further control the distance 230, and thus the resultant value of passive component 104.

Figure 3:
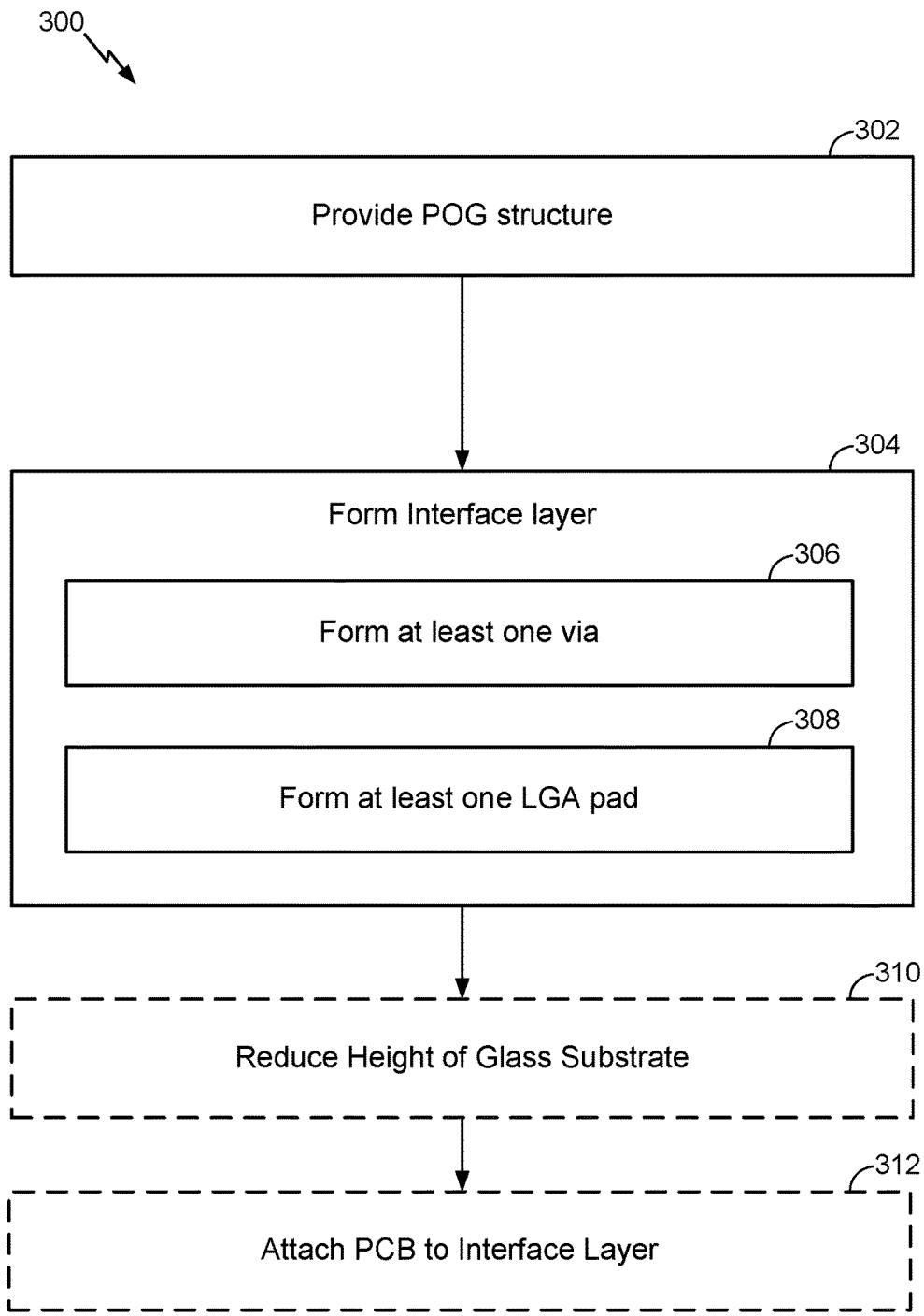
FIG. 3 is a flow-chart of a method of forming a device having a POG structure and interface layer.

It will be appreciated that embodiments include various methods for performing the processes, functions and/or algorithms disclosed herein. For example, as illustrated in FIG. 3, aspects may include a process 300 of forming a device (e.g., device 200). The process 300 includes a process block 302 of providing a POG structure (e.g., glass substrate 102, contact pads 103, and passive component 104) and a process block 304 of forming an interface layer (e.g., interface layer 205). Process block 304 of forming the interface layer 205 may include adding the molding compound to the first surface 203 of the glass substrate 102 and over the contact pads 103 and passive component 104. Forming the interface layer 205 may also include a process block 306 of forming at least one via 210 and a process block 308 of forming at least one LGA pad 220. As mentioned above, forming the at least one via 210 may include performing a laser drilling process to expose the contact pads 103 of the POG structure.

FIG. 3 further illustrates process 300 as including optional process blocks 310 and 312. Optional process block 310 includes reducing the height 225 of the glass substrate 102 after forming the interface layer 205. As mentioned above, reducing the height 225 of the glass substrate 102 may include grinding down a top surface 211 of the glass substrate 102 until the height 225 is reduced or until the glass substrate 102 is completely removed. Optional process block 312 includes attaching the PCB 108 to the interface layer 205. As mentioned above, attaching the PCB 108 to the interface layer 205 may include attaching one or more PCB contact pads 250 to a corresponding one or more LGA pads 220 of the interface layer 205.

The components and functions represented by FIGS. 2A-2H and 3, as well as other components and functions described herein, may be implemented using any suitable means. Such means also may be implemented, at least in part, using corresponding structure as taught herein. For example the components described above in conjunction with the components of FIGS. 2A-2H also may correspond to similarly designated "means for" functionality. Thus, in some aspects one or more of such means may be implemented using other suitable structure as taught herein.

By way of illustration, a device may include a passive-on-glass (POG) structure. The POG structure includes a glass substrate, a passive component disposed on a first surface of the glass substrate, and at least one contact pad formed on the first surface of the glass substrate. The device also includes at least one land grid array (LGA) pad formed on a surface of the device that is to be incident with a printed circuit board (PCB) of a package. Further included in the device is a means for electrically connecting the at least one contact pad with the at least one LGA pad while maintaining a distance between the passive component and a ground plane of the PCB that is independent of a line spacing utilized by the PCB. In one aspect, the means for electrically connecting the at least one contact pad may correspond, for example, to interface layer 205, via 210, and/or LGA pads 220.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, aspects of the present disclosure can include a computer readable media embodying a method for forming a device having a POG structure as discussed herein.

Accordingly, the present disclosure is not limited to illustrated examples and any means for performing the functionality described herein are included in examples of the concepts proved herein.

While the foregoing disclosure shows illustrative aspects, it should be noted that various changes and modifications could be made herein without departing from the scope of the present disclosure as defined by the appended claims. The functions, steps and/or actions of the method claims in accordance with the aspects of the present disclosure described herein need not be performed in any particular order. Furthermore, although aspects of the present disclosure may be described or claimed in the singular, the plural is contemplated unless limitation to the singular is explicitly stated.

What is claimed is:

1. A device comprising:
a passive-on-glass (POG) structure comprising:
a glass substrate;
a passive component on a first surface of the glass substrate; and
at least one contact pad on the first surface of the glass substrate;
an interface layer comprising a second surface on and in direct contact with the first surface of the glass substrate such that the passive component and the at least one contact pad are located between the first surface of the glass substrate and the interface layer;
at least one land grid array (LGA) pad on and in direct contact with a third surface of the interface layer, wherein the third surface of the interface layer is opposite the second surface of the interface layer; and
at least one via in the interface layer configured to electrically connect the at least one contact pad with the at least one LGA pad,
wherein the passive component is on and in direct contact with the interface layer.

2. The device of claim 1 further comprising a printed circuit board (PCB),
wherein the PCB is coupled to the at least one LGA pad on the third surface of the interface layer.

3. The device of claim 2,
wherein the PCB comprises a ground plane, and
wherein the passive component is separated from the ground plane by a distance that is independent of a line spacing utilized by the PCB.

4. The device of claim 3,
wherein a value of a parameter characterizing the passive component is dependent on a distance separating the passive component and the ground plane, and
wherein the value of the parameter characterizing the passive component is an inductance value when the passive component is an inductor and is a capacitance value when the passive component is a capacitor.

5. The device of claim 1, wherein the passive component comprises a capacitor.

6. The device of claim 1, wherein the passive component comprises an inductor.

7. The device of claim 1, wherein the interface layer is a mold formed over the passive component and the at least one contact pad.

8. The device of claim 7, wherein the mold comprises a dielectric or an insulating material.

9. A package, comprising:
a passive-on-glass (POG) structure comprising:
a glass substrate;
a passive component on a first surface of the glass substrate; and
at least one contact pad formed on the first surface of the glass substrate;
a mold comprising a second surface on and in direct contact with the first surface of the glass substrate and on the passive component and the at least one contact pad, such that the passive component and the at least one contact pad are located between the first surface of the glass substrate and the mold;
at least one land grid array (LGA) pad on and in direct contact with a third surface of the mold, wherein the third surface of the mold is opposite the second surface of the mold;
at least one via formed in the mold and configured to electrically connect the at least one contact pad with the at least one LGA pad; and
a printed circuit board (PCB) comprising:
a ground plane; and
a top metal layer comprising a PCB contact pad, wherein the PCB contact pad is directly connected to the at least one LGA pad on the third surface of the mold,
wherein the passive component is on and in direct contact with the mold.

10. The package of claim 9, wherein the passive component is separated from the ground plane by a distance that is independent of a line spacing utilized by the PCB.

11. The package of claim 10,
wherein a value of a parameter characterizing the passive component is dependent on a distance separating the passive component and the ground plane, and
wherein the value of the parameter characterizing the passive component is an inductance value when the passive component is an inductor and is a capacitance value when the passive component is a capacitor.

12. The package of claim 9, wherein the passive component comprises a capacitor.

13. The package of claim 9, wherein the passive component comprises an inductor.

14. A device, comprising:
a passive-on-glass (POG) structure comprising:
a glass substrate;
a passive component on a first surface of the glass substrate; and
at least one contact pad on the first surface of the glass substrate;
a mold comprising a second surface on and in direct contact with the first surface of the glass substrate and on the passive component and the at least one contact pad such that the passive component and the at least one contact pad are located between the first surface of the glass substrate and the mold;
at least one land grid array (LGA) pad on and in direct contact with a third surface of the mold, wherein the third surface of the mold is opposite the second surface of the mold; and
means for electrically connecting the at least one contact pad with the at least one LGA pad,
wherein the means for electrically connecting is in the mold, and
wherein the passive component is on and in direct contact with the mold.

15. The device of claim 14,
wherein a value of a parameter characterizing the passive component is dependent on a distance between the passive component and a ground plane of the PCB, and wherein the value of the parameter characterizing the passive component is an inductance value when the passive component is an inductor and is a capacitance value when the passive component is a capacitor.

16. The device of claim 14, wherein the passive component comprises a capacitor.

17. The device of claim 14, wherein the passive component comprises an inductor.

18. The device of claim 14, the mold maintains a distance between the passive component and a ground plane of the PCB that is independent of a line spacing utilized by the PCB.

19. The device of claim 1, wherein all surfaces of the passive component not in direct contact with the glass substrate are in direct contact with the interface layer.

20. The package of claim 9, wherein all surfaces of the passive component not in direct contact with the glass substrate are in direct contact with the mold.

21. The device of claim 14, wherein all surfaces of the passive component not in direct contact with the glass substrate are in direct contact with the mold.

22. The device of claim 1, wherein there are no vias within the interface layer that directly contacts both the passive component and any LGA pad.

23. The package of claim 9, wherein there are no vias within the mold that directly contacts both the passive component and any LGA pad.

24. The device of claim 14, wherein there are no means for electrically connecting within the mold that directly contacts both the passive component and any LGA pad.

25. The device of claim 1, wherein at least a portion of the at least one contact pad and at least a portion of the (LGA) pad are below the second surface of the interface layer such that the interface layer is in direct contact with at least a portion of side surfaces of the at least one contact pad and at least a portion of side surfaces of the at least one LGA pad.

26. The package of claim 9, wherein at least a portion of the at least one contact pad and at least a portion of the (LGA) pad are below the second surface of the mold such that the mold is in direct contact with at least a portion of side surfaces of the at least one contact pad and at least a portion of side surfaces of the at least one LGA pad.

27. The device of claim 14, wherein at least a portion of the at least one contact pad and at least a portion of the (LGA) pad are below the second surface of the mold such that the mold is in direct contact with at least a portion of side surfaces of the at least one contact pad and at least a portion of side surfaces of the at least one LGA pad.

* * * * *